(12) United States Patent
Hetzer et al.

(10) Patent No.: US 8,435,083 B2
(45) Date of Patent: May 7, 2013

(54) PLUG-IN CONNECTOR

(75) Inventors: Ulrich Hetzer, Berlin (DE); Ferenc Nad, Berlin (DE)

(73) Assignee: ADC GmbH, Berlin (DE)

( * ) Notice: Subject to any disclaimer, the term of this patent is extended or adjusted under 35 U.S.C. 154(b) by 0 days.

(21) Appl. No.: 13/338,064

(22) Filed: Dec. 27, 2011

(65) Prior Publication Data

US 2012/0164884 A1 Jun. 28, 2012

Related U.S. Application Data

(63) Continuation of application No. 12/525,937, filed as application No. PCT/EP2007/010935 on Dec. 13, 2007, now Pat. No. 8,083,551.

(30) Foreign Application Priority Data

Feb. 6, 2007 (DE) .......................... 10 2007 005 959

(51) Int. Cl.
*H01R 24/00* (2011.01)
(52) U.S. Cl.
USPC ........................................................ 439/676
(58) Field of Classification Search ................ 439/76.1, 439/77, 344, 676
See application file for complete search history.

(56) References Cited

U.S. PATENT DOCUMENTS

| 6,641,443 | B1 | 11/2003 | Itano et al. | |
|---|---|---|---|---|
| 6,786,776 | B2 | 9/2004 | Itano et al. | |
| 6,953,362 | B2 * | 10/2005 | Mossner et al. | 439/395 |
| 6,981,887 | B1 * | 1/2006 | Mese et al. | 439/244 |
| 7,025,621 | B2 * | 4/2006 | Mossner et al. | 439/395 |
| 7,270,563 | B2 * | 9/2007 | Mossner et al. | 439/404 |
| 7,549,891 | B2 * | 6/2009 | Mossner et al. | 439/404 |
| 8,083,551 | B2 | 12/2011 | Hetzer et al. | |
| 2005/0202697 | A1 * | 9/2005 | Caveney et al. | 439/77 |

FOREIGN PATENT DOCUMENTS

| DE | 100 51 097 | 3/2002 |
|---|---|---|
| DE | 20 2004 003 6 | 6/2004 |
| DE | 20 2005 017 0 | 1/2006 |
| DE | 20 2006 009 5 | 9/2006 |
| EP | 1 571 735 | 9/2005 |
| WO | WO 2005/101579 | 10/2005 |

\* cited by examiner

*Primary Examiner* — Khiem Nguyen
(74) *Attorney, Agent, or Firm* — Merchant & Gould P.C.

(57) ABSTRACT

The invention relates to a plug-in connector (1), comprising a housing, a printed circuit board (2) and RF contacts (K1-K8), the RF contacts (K1-K8) being electrically connected to the printed circuit board (2), the RF contacts (K1-K8) being formed by an integral, flexible printed circuit board (4), from which the individual contacts (K1-K8) are cut free, the flexible printed circuit board (4) being prestressed by a spring-elastic element (6).

11 Claims, 4 Drawing Sheets

PLUG-IN CONNECTOR

CROSS-REFERENCE PARAGRAPH

This application is a continuation of U.S. application Ser. No. 12/525,937, filed Apr. 15, 2010 now U.S. Pat. No. 8,083, 551, and titled "PLUG-TYPE CONNECTOR," which is a National Stage Application of PCT/EP2007/010935, filed 13 Dec. 2007, which claims benefit of Ser. No. 10 2007 005 959.2, filed 6 Feb. 2007 in Germany and which applications are incorporated herein by reference. To the extent appropriate, a claim of priority is made to each of the above disclosed applications.

BACKGROUND

Such a generic plug-in connector is known from DE 100 51 097 A1.

Furthermore, such a generic plug-in connector is known from US 2005/0202697 A1, wherein the printed circuit board for accommodating the RF contacts is in the form of a flexible printed circuit board.

Since the requirements as regards transmission capacities are becoming ever greater, the length of the RF contacts represents a restricting boundary condition, but the length cannot be shortened as desired since the RF contacts still need to carry out sufficiently great resilient excursion movements in order to compensate for tolerances of the mating plug-in connector and to ensure reliable electrical contact with sufficient contact force.

SUMMARY

The invention is therefore based on the technical problem of providing a plug-in connector with improved electrical transmission properties.

In this regard, the plug-in connector comprises a housing, a printed circuit board and RF contacts, the RF contacts being electrically connected to the printed circuit board, the RF contacts being formed by an integral, flexible printed circuit board, from which the individual RF contacts are cut free, the flexible printed circuit board being prestressed by a spring-elastic element.

As a result, the RF contacts can be selected to be shorter in terms of their dimensions, the necessary excursion being applied by the spring-elastic element.

In one preferred embodiment, the spring-elastic element is in the form of an elastomer.

In a further preferred embodiment, the flexible printed circuit board is arranged on an anvil and is connected thereto, the spring-elastic element being arranged beneath the anvil. The anvil is in this case preferably fixedly connected to the flexible printed circuit board, for example welded, and is used as a mechanical support for the flexible printed circuit board. Further preferably, the anvil has an integral design. The anvil consists of an electrically nonconductive material. The prestress is in this case produced by the anvil being pressed onto the elastomer, for which purpose a comb element is pressed from above in a defined manner onto the anvil. In addition to this, this comb element is used for the lateral mechanical stabilization of the flexible printed circuit board or of the anvil.

In a further preferred embodiment, the rigid printed circuit board, which bears the flexible printed circuit board, is mounted such that it can move via a spring-elastic element. As a result, a large proportion of the required excursion movement can be applied via the movement of the rigid printed circuit board, with the result that the required excursion movement of the flexible printed circuit board can be selected to be very small. The spring-elastic element may likewise be in the form of an elastomer or in the form of a leaf spring.

In a further preferred embodiment, the housing is designed to have two parts, the spring-elastic element being mounted in the first housing part, the printed circuit board being fixedly mounted in the second housing part, and the first and second housing parts being connected to one another such that they can move. This ensures that the excursion movements of the rigid printed circuit board do not have any effects on other contacts on the printed circuit board.

In a further preferred embodiment, the connection between the first and second housing parts is in the form of a pivot bearing.

In a further preferred embodiment, at least two adjacent RF contacts are designed to be bent in opposite directions toward the contact region, with the result that the capacitive coupling between them is minimized.

In a further preferred embodiment, additional capacitances are formed on the flexible printed circuit board and compensate for the crosstalk, further preferably the capacitances forming a non-current-carrying path. The advantage of the compensation on the flexible printed circuit board is the fact that the compensation takes place directly at the location of the crosstalk. If, furthermore, the compensation takes place in a non-current-carrying path, which branches off from the contact region, the propagation time is zero, i.e. it is compensated for in phase.

In a further preferred embodiment, additional capacitances are formed on the rigid printed circuit board. This can take place, for example, by conductor tracks or additional non-current-carrying conductor tracks being crossed over.

A preferred application area of the plug-in connector according to the invention is the design as an RJ45 socket.

BRIEF DESCRIPTION OF THE DRAWINGS

The invention will be explained in more detail below with reference to a preferred exemplary embodiment. In the figures.

DETAILED DESCRIPTION

Figure 1:
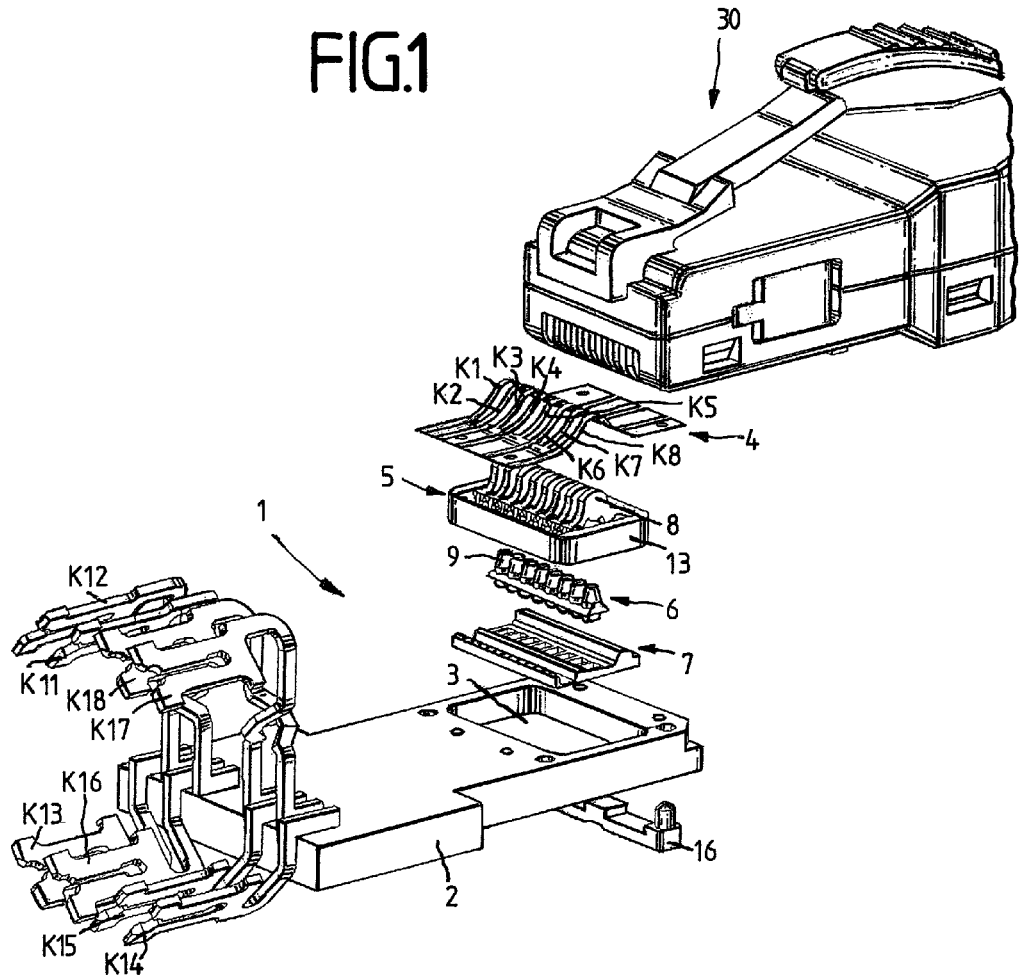
FIG. 1 shows a perspective, exploded illustration of a plug-in connector with the housing removed.
Figure 2:
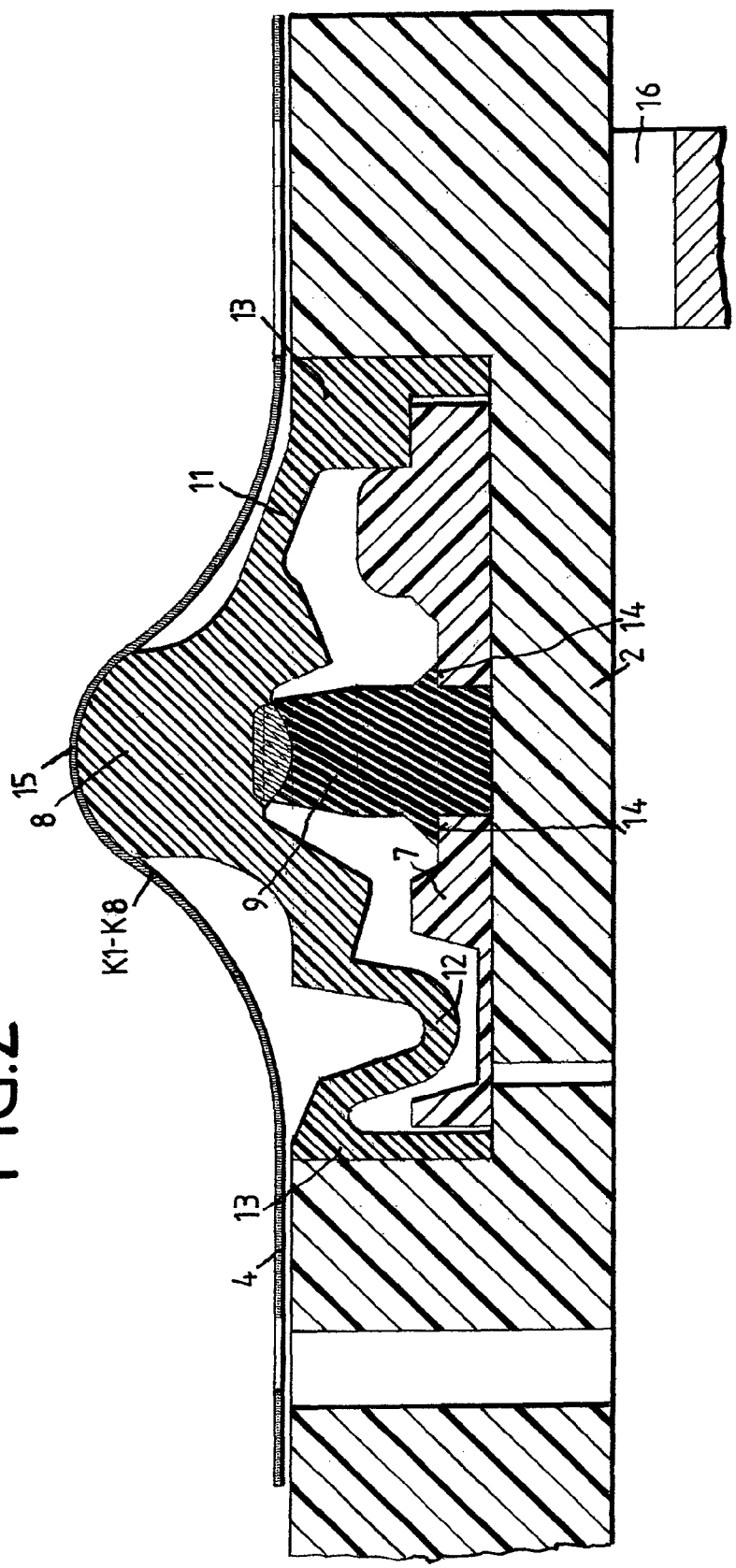
FIG. 2 shows a sectional illustration through the plug-in connector.
Figure 3:
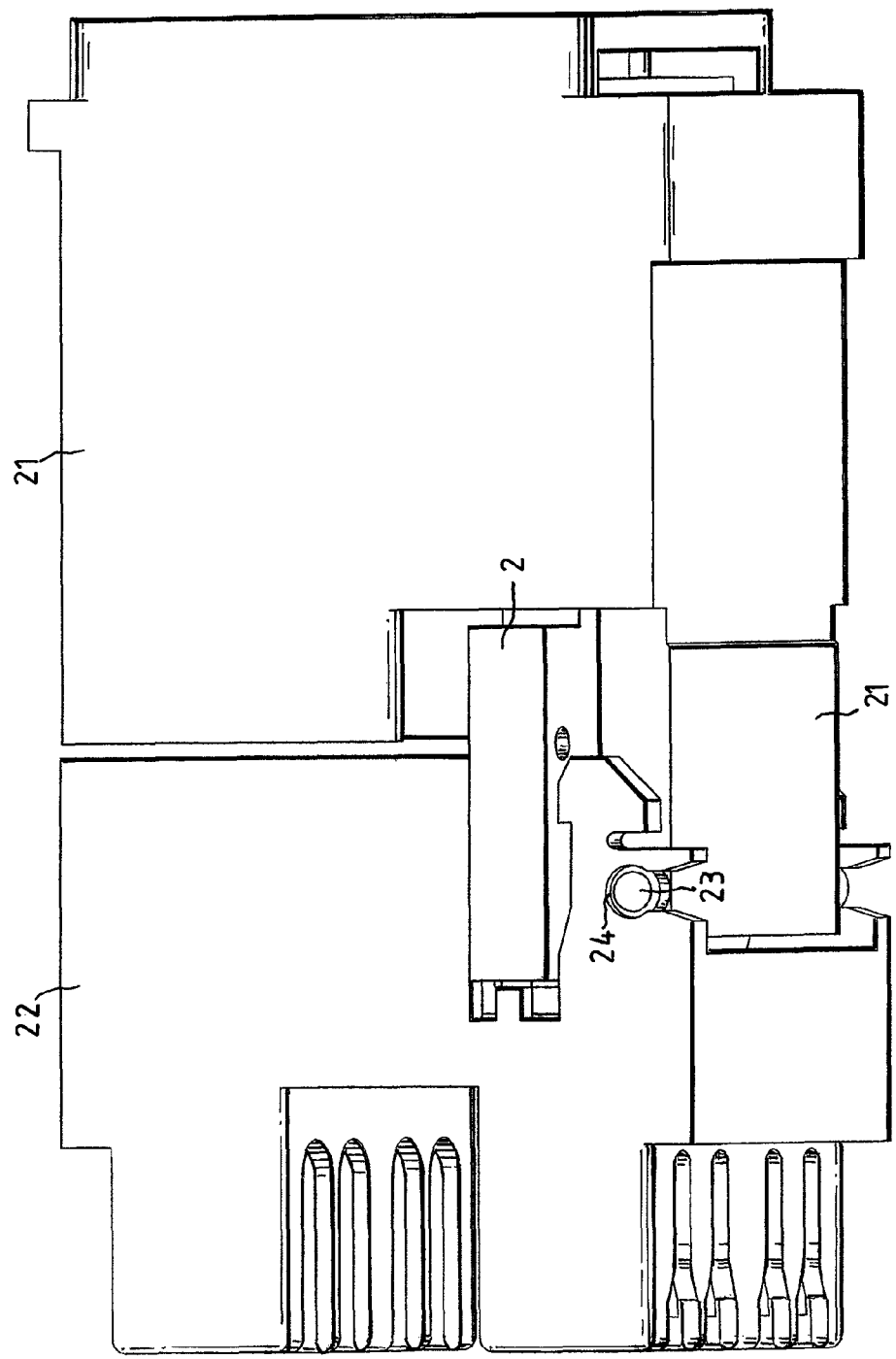
FIG. 3 shows a side view of the housing of the plug-in connector.

FIG. 1 illustrates the plug-in connector 1 in the form of an RJ45 socket. The plug-in connector 1 comprises a rigid printed circuit board 2 having a receptacle 3. Furthermore, the plug-in connector 1 comprises a flexible printed circuit board 4, an anvil 5, an elastomer element 6 and an elastomer receptacle 7. RF contacts K1-K8 are cut free from the flexible printed circuit board 4. The flexible printed circuit board 4 consists of an electrically nonconductive base material, onto which metallic structures for forming contacts and conductor tracks are applied. The RF contacts K1-K8 which are cut free are in this case bent upward, in which case, as will be explained later in relation to FIG. 4, not the entire arch forms the RF contact K1-K8. The flexible printed circuit board 4 is fixedly connected to the anvil 5, which consists integrally of a nonconductive plastic. The anvil 5 also has cut-free portions, the RF contacts K1-K8 resting on the arches 8 of the anvil 5, which can be seen in FIG. 2. The preferably integral elastomer element 6 has eight knobs 9, which are each arranged beneath an arch 8 of the anvil 5. Owing to a comb element (not illustrated) above the flexible printed circuit board 4, the arches 8 of the anvil 5 then push the knobs 9 down (see FIG. 2), with the result that the RF contacts K1-K8 are prestressed in spring-elastic fashion. The arches 8 of the anvil 5 are in this case connected on one side to a frame structure 13 of the anvil 5 by a film hinge 11 and an elastic tie 12. The film hinge 11 in this case forms the point of rotation of the arrangement at the tie point for the frame structure 13. The elastic tie 12 does not have any further force effect and serves the purpose primarily of stabilizing the anvil 5. An excursion limitation means 14 is also arranged between the arch 8 and the elastic tie 12 and limits the upward excursion.

The elastomer element 6 is held by the elastomer receptacle 7, which in turn is arranged in the receptacle 3 of the rigid printed circuit board 2. As can be seen in particular in FIG. 2, the knobs 9 lie in a depression in the elastomer receptacle 7, stop edges 14 of the knob 9 resting on the upper side of the elastomer receptacle 7. The actual contact region 15 of the RF contact K1-K8 is in this case at the apex of the arch of the flexible printed circuit board 4.

An intermediate piece 16 is arranged beneath the rigid printed circuit board 2, a spring-elastic element (not illustrated), for example in the form of a leaf spring, in turn being arranged beneath said intermediate piece. In the assembled state, the printed circuit board 2 is then prestressed by this spring-elastic element.

Eight insulation displacement contacts K11-K18 are arranged on the opposite side of the printed circuit board 2 and are connected to the printed circuit board 2 via SMD-like contacts. The insulation displacement contacts K11-K18 are connected to the associated RF contacts K1-K8 via conductor tracks (not illustrated), in each case K1 being connected to K11, K2 to K12 and so on.

In order that the excursion movement of the printed circuit board 2, owing to the spring-elastic element (not illustrated) beneath the intermediate piece 16, does not have any effects on the soldered joints in the case of the SMD-like contacts, the housing of the plug-in connector 1 is designed to have two parts. The first housing part 21 in this case has a receiving opening for the mating plug-in connector 30 (see FIG. 1) and receives the intermediate piece 16 and the spring-elastic element. The second housing part 22 receives the insulation displacement contacts K11-K18, the printed circuit board 2 being mounted fixedly in the second housing part 22. The first housing part 21 and the second housing part 22 are in this case connected to one another such that they can move via a pivot bearing, for which purpose the first housing part 21 is designed to have at least one cylinder 23, and the second housing part 22 is designed to have a complementary receptacle 24. As a result, the excursion movement of the printed circuit board 2 is decoupled. Owing to this excursion movement of the printed circuit board 2, the RF contacts K1-K8 can now be designed to be very short, since the majority of the required excursion movement is compensated for for the purpose of compensating for component tolerances of the plug-in connector 1 and the mating plug-in connector 30, simply by the excursion movement of the printed circuit board 2.

Figure 4:
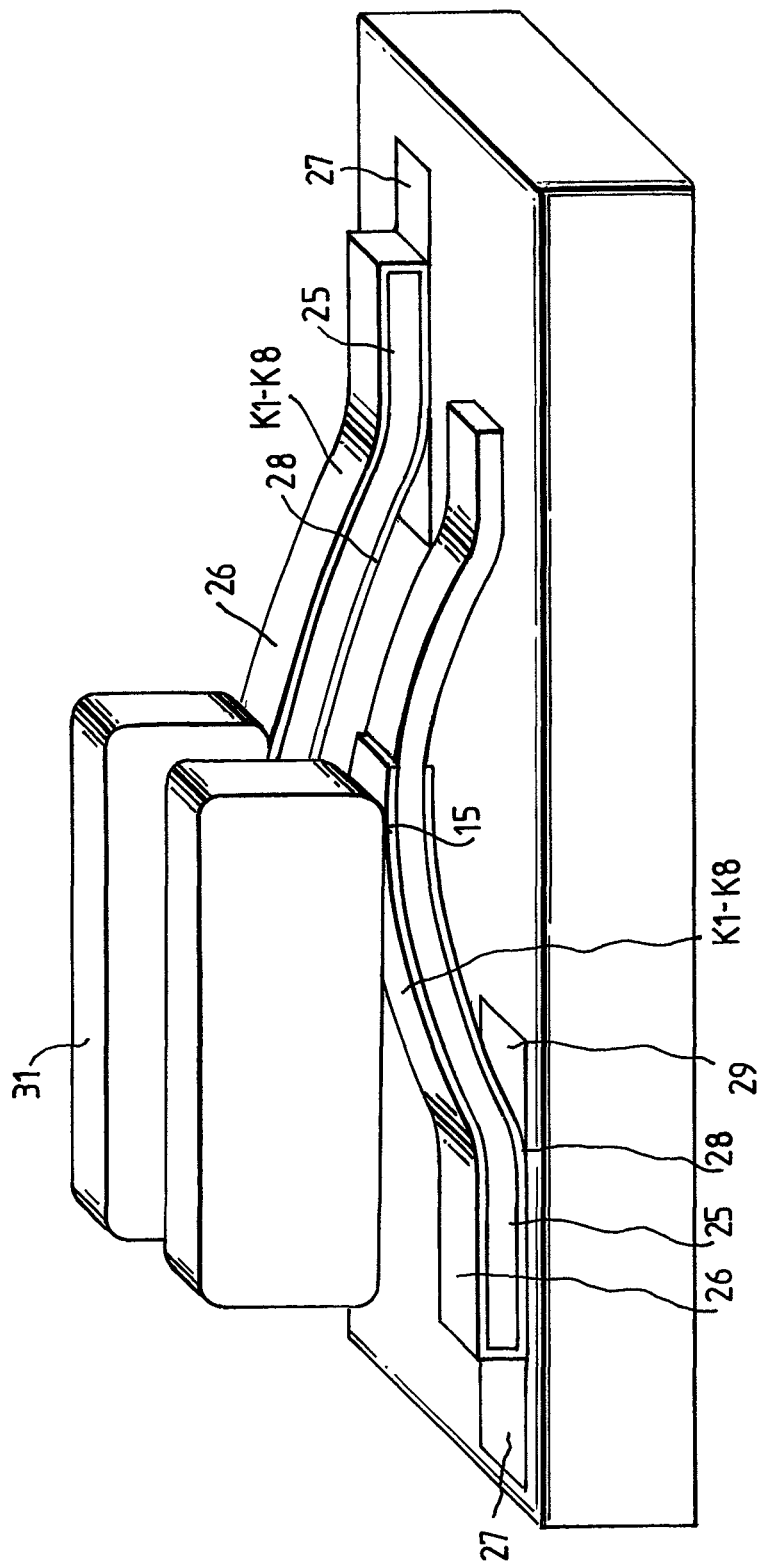
FIG. 4 shows a schematic illustration of two adjacent RF contacts with contact guidance bent in opposite directions.

FIG. 4 illustrates, schematically, a basic principle for reducing and compensating for the near-end crosstalk NEXT using two adjacent RF contacts K1-K8, in very simplified form only the cut-free RF contacts K1-K8 being illustrated without the rest of the flexible printed circuit board 4. The front RF contact has a metallization 26 from the contact region 15 on the upper side of the flexible base material 25, which metallization produces an electrical connection at a contact point 27 to the rigid printed circuit board 2, which electrical connection is then passed, by a conductor track, to the SMD-like contacts. Furthermore, a further metallization 28 passes from the contact region 15 on the lower side to a further contact point 29 on the printed circuit board 2. There, a further conductor track on the flexible printed circuit board 4 and/or rigid printed circuit board 2 can be connected, if appropriate, but this conductor track is open, i.e. no signal flow takes place there. The metallization 26 on the upper side of the flexible base material 25 in this case represents the actual RF contact K1-K8. As can be seen, the front RF contact bends upwards from the left to the right. In the case of the rear RF contact, however, this is precisely the opposite, i.e. the current-carrying RF contacts only have a minimum capacitive coupling. The already reduced crosstalk can then also be further compensated for via the non-current-carrying paths of the lower metallization 28 and the correspondingly guided conductor tracks, owing to the direct compensation process at the contact region 15, no phase differences occurring. Crosstalk and compensation are therefore in phase. Above the contacts regions 15, the contacts 31 of the mating plug-in connector 30 are in this case illustrated schematically. However, note should be made of the fact that it is not absolutely necessary for the RF contacts K1-K8 to be bent back in opposite directions.

List of Reference Symbols
1 Plug-in connector
2 Rigid printed circuit board
3 Receptacle
4 Flexible printed circuit board
5 Anvil
6 Elastomer element
7 Elastomer receptacle
8 Arch
9 Knobs
11 Film hinge
12 Elastic tie
13 Frame structure
14 Stop edges
15 Contact region
16 Intermediate piece
21 First housing part
22 Second housing part
23 Cylinder
24 Receptacle
25 Flexible base material
26 Metallization
27 Contact point
28 Further metallization
29 Further contact point
30 Mating plug-in connector
31 Contacts
K1-K8 RF contacts
K11-K18 Insulation displacement contacts

The invention claimed is:
1. A plug-in connector, comprising:
a housing holding a printed circuit board;
a flexible printed circuit board from which a plurality of sections are cut free;
a plurality of RF contacts, each of the RF contacts being formed at one of the cut free sections of the flexible printed circuit board, and each of the RF contacts being electrically connected to the printed circuit board held by the housing; and a spring-elastomeric element including a plurality of individual springs, each spring being disposed beneath one of the cut free sections of the flexible printed circuit board to bias the respective cut free section.

2. The plug-in connector as claimed in claim 1, further comprising a receptacle coupled to the housing, the receptacle defining a plurality of depressions, each of the springs of the spring-elastomeric element including a knob disposed in one of the depressions of the receptacle.

3. The plug-in connector as claimed in claim 2, wherein each of the knobs includes a stop edge that rests on an upper side of the receptacle.

4. The plug-in connector as claimed in claim 1, wherein the housing includes a first part and a second part, the printed circuit board being fixedly mounted in the second part, and the first and second parts being moveably connected to one another.

5. The plug-in connector as claimed in claim 4, wherein the first and second parts are pivotally connected to one another.

6. The plug-in connector as claimed in claim 1, wherein at least two adjacent contacts are bent in opposite directions toward the contact region.

7. The plug-in connector as claimed in claim 1, wherein additional capacitances are formed on the flexible printed circuit board and compensate for crosstalk.

8. The plug-in connector as claimed in claim 7, wherein the capacitances form a non-current-conducting path.

9. The plug-in connector as claimed in claim 1, wherein additional capacitances are formed on the printed circuit board.

10. The plug-in connector as claimed in claim 1, wherein the plug-in connector forms an RJ45 socket.

11. The plug-in connector as claimed in claim 1, further comprising an anvil including a plurality of arches moveable relative to a frame structure, the frame structure being coupled to the housing, each of the arches being positioned between one of the cut free sections of the flexible printed circuit board and the respective one of the springs.

* * * * *

UNITED STATES PATENT AND TRADEMARK OFFICE
CERTIFICATE OF CORRECTION

| | |
|---|---|
| PATENT NO. | : 8,435,083 B2 |
| APPLICATION NO. | : 13/338064 |
| DATED | : May 7, 2013 |
| INVENTOR(S) | : Hetzer et al. |

It is certified that error appears in the above-identified patent and that said Letters Patent is hereby corrected as shown below:

Title page, (56) References Cited, Foreign Patent Documents: The following 3 German Patents are listed incompletely (each are missing the last two digits). They should be listed as:
--20 2004 003 635    6/2004    DE
20 2005 017 035    1/2006    DE
20 2006 009 504    9/2006    DE--

Signed and Sealed this
Twelfth Day of November, 2013

Teresa Stanek Rea
*Deputy Director of the United States Patent and Trademark Office*